United States Patent
Nagatani et al.

(10) Patent No.: US 8,394,509 B2
(45) Date of Patent: Mar. 12, 2013

(54) SURFACE-TREATED COPPER FOIL

(75) Inventors: Seiji Nagatani, Saitama (JP); Hiroshi Watanabe, Kitamato (JP); Kazufumi Izumida, Kuala Lumpur (MY)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 13/002,394

(22) PCT Filed: Jun. 26, 2009

(86) PCT No.: PCT/JP2009/061710
§ 371 (c)(1),
(2), (4) Date: Mar. 22, 2011

(87) PCT Pub. No.: WO2010/004885
PCT Pub. Date: Jan. 14, 2010

(65) Prior Publication Data
US 2011/0189503 A1 Aug. 4, 2011

(30) Foreign Application Priority Data
Jul. 11, 2008 (JP) .................................. 2008-181266

(51) Int. Cl.
*B32B 15/04* (2006.01)

(52) U.S. Cl. ........ 428/674; 428/216; 428/336; 428/548; 428/607; 428/642; 428/634; 428/660

(58) Field of Classification Search .................. 428/209, 428/512, 615, 642, 216, 336, 548, 607, 634, 428/660, 674
See application file for complete search history.

(56) References Cited

U.S. PATENT DOCUMENTS

| | | | |
|---|---|---|---|
| 5,366,814 A * | 11/1994 | Yamanishi et al. | 428/607 |
| 6,451,441 B1 * | 9/2002 | Nishimoto et al. | 428/461 |
| 6,911,265 B2 * | 6/2005 | Nishinaka et al. | 428/458 |
| 7,223,481 B2 * | 5/2007 | Suzuki et al. | 428/612 |
| 7,691,487 B2 * | 4/2010 | Nagatani | 428/607 |
| 7,749,610 B2 | 7/2010 | Iwakiri et al. | |
| 7,883,783 B2 | 2/2011 | Nagatani | |
| 8,187,722 B2 * | 5/2012 | Nagatani et al. | 428/607 |
| 2007/0237976 A1 | 10/2007 | Okada et al. | |
| 2008/0107865 A1 | 5/2008 | Matsunaga et al. | |
| 2009/0029186 A1 | 1/2009 | Matsunaga | |
| 2009/0047539 A1 | 2/2009 | Dobashi et al. | |
| 2009/0095515 A1 | 4/2009 | Sakai et al. | |
| 2009/0166213 A1 | 7/2009 | Dobashi et al. | |
| 2009/0291319 A1 | 11/2009 | Nagatani et al. | |
| 2010/0038115 A1 | 2/2010 | Matsuda et al. | |
| 2010/0068511 A1 | 3/2010 | Matsunaga et al. | |

FOREIGN PATENT DOCUMENTS

| | | |
|---|---|---|
| JP | 7-170064 | 7/1995 |
| JP | 2000-340911 | 12/2000 |
| JP | 2001-177204 | 6/2001 |
| JP | 2007-081274 | 3/2007 |
| JP | 2007-307767 | 11/2007 |
| WO | WO2007/135972 | 11/2007 |

* cited by examiner

*Primary Examiner* — Cathy Lam
(74) *Attorney, Agent, or Firm* — Greenblum & Bernstein, P.L.C.

(57) ABSTRACT

Object is to provide a surface-treated copper foil free from chromium in the surface-treatment layer and excellent in peel strength of a circuit and chemical resistance against to degradation of the peel strength after processing into a printed wiring board. To achieve the object, the surface-treated copper foil having a surface-treatment layer on a bonding surface of a copper foil for manufacturing a copper-clad laminate by laminating it to an insulating resin substrate has the surface-treatment layer formed by depositing a metal component having high melting point not lower than 1400° C. by dry process film formation method to the bonding surface of the copper foil after the cleaning treatment and further depositing a carbon component to the surface.

8 Claims, No Drawings

SURFACE-TREATED COPPER FOIL

TECHNICAL FIELD

The present invention relates to a surface-treated copper foil. In particular, the invention relates to a surface-treated copper foil for manufacturing a printed wiring board in which a surface-treatment layer of the surface treated copper foil is formed by using a dry process film formation method.

BACKGROUND ART

In the conventional processing of the copper clad laminate into a printed wiring board, etching by solution has been mainly employed. Therefore, sufficient adhesion performance has been required not only between a copper foil and an insulating resin substrate as a copper-clad laminate but also between a circuit and the insulating resin substrate after processing into a printed wiring board.

In order to satisfy such requirements, many efforts to apply a surface treatment to a bonding surface of the copper foil for manufacturing a printed wiring board have been made as a measure to enhance adhesion performance to the insulating resin substrate. In addition, a chromium component has been widely used as a rust-proofing element or an element to change surface properties in the conventional copper foils for manufacturing a printed wiring board utilizing the manners, chromium plating, chromate treatment or the like. In particular, chromate treatment has been applied to the recent copper foils shipped to the market.

Examples in which a chromium component is used as a surface-treatment component will be described. For example, Patent Document 1 discloses copper foils for a printed wiring board superior in adhesion performance (bond strength between base material and copper foil), moisture resistance, chemical resistance and heat resistance. One of the copper foils has a vapor deposited metal chrome layer on one surface or both surfaces of copper foil, for example, vapor-deposited chromium layer formed by a sputtering method. And another one of copper foils is supported the one surface on a carrier via a release layer and the opposite surface of the copper foil has a vapor-deposited metal chrome layer, for example, vapor-deposited chromium layer formed by a sputtering method.

Patent Document 2 discloses a copper foil in which the performance of a silane coupling agent for increasing the bond strength of a copper foil used for manufacturing a printed wiring board to a substrate is enhanced in maximum. The surface-treated copper foil for a printed wiring board is manufactured by forming a zinc or zinc alloy layer on a surface of a copper foil, and forming an electrolytic chromate layer on the surface of the zinc or zinc alloy layer as a rust-proofing treatment, and then a silane coupling agent-adsorbed layer is formed on the electrolytic chromate layer without drying the electrolytic chromate layer, and finished by drying.

When the chromium component used as a component for surface treatment described above exists as a chromium compound, oxidation number is trivalent or hexavalent. In addition, as for biological toxicity, hexavalent chromium is much higher and mobility in the soil is faster in hexavalent chromium and is heavier in environment load.

With regard to the wastes containing a hazardous substance harmful to human body such as chromium, transboundary movements have been occurred world-wide since 1970s. As a result, problems such as an environmental pollution are generated by a hazardous waste shipped from industrialized countries and left in developing countries or the like. Then, "Basel Convention on the Control of Transboundary Movements of Hazardous Wastes and their Disposal" was created in 1980s to establish international framework and procedures on the regulations of transboundary movements of certain types of wastes. The convention came into force in 1993 in Japan.

In recent years, the ELV directive of EU (European Union) has prohibited the use of specified substances with a high environment load (i.e. lead, hexavalent chromium, mercury, and cadmium) in a vehicle to be registered in EU Market on Jul. 1, 2003 or later. In the ELV directive, proactive use of trivalent chromium is recommended. Also in the electric and electronics industry, Waste Electrical and Electronic Equipment (WEEE) directive and Restriction on Hazardous Substances (RoHS) directive in Europe have reached final agreements to restrict the use of six specific hazardous substances including hexavalent chromium ($Cr^{6+}$) for electrical or electronic devices as environmentally risky substances, even though the substances are separately collected from waste electrical or electronic devices. A printed wiring board is one of the subjects regulated.

In addition, due to increased awareness on environmental matters in recent years, it is afraid of that trivalent chromium used may be converted to hexavalent chromium by a wrong disposal processing or may be identified to be hexavalent chromium through a wrong procedure of analysis. According to such background, application of a copper foil for a printed wiring board free from chromium component itself has been investigated.

For example, Patent Document 3 discloses a metal foil having a bonding-promotion layer on at least one surface characterized in that the bonding-promotion layer contains at least one silane coupling agent and is chromium-free, and the base surface of the metal foil prepared under a bonding-promotion layer is not increased surface roughness. Or, as the metal foil characterized in that a base surface is free from a zinc layer or chromium layer attached, concept including chromium-free copper foil is disclosed. One of the metal foils disclosed is provided with a metal layer composed of a metal selected from the group consisting of indium, tin, nickel, cobalt, brass, bronze or a mixture of at least two of these metals between the base surface of the metal foil and the bonding-promotion layer of the metal foil. Another one metal foil disclosed is provided with a metal layer composed of a metal selected from the group consisting of tin, mixture of chromium and zinc, nickel, molybdenum, aluminum or a mixture of at least two of these metals between the base surface of the metal foil and the bonding-promotion layer of the metal foil.

LIST OF THE DOCUMENTS CITED

Patent Documents

Patent Document 1: Japanese Patent Laid-Open No. 2000-340911
Patent Document 2: Japanese Patent Laid-Open No. 2001-177204
Patent Document 3: Japanese Patent Laid-Open No. 07-170064

DISCLOSURE OF THE INVENTION

Problems to be Solved of the Invention

In general, a rust-proofing treatment layer is applied to protect a copper foil from atmospheric oxidation to secure long-term shelf life. However, a kind of the rust-proofing treatment layer makes adhesion performance to a resin substrate change and it especially affects on peel strength of a circuit after processing into a printed wiring board, chemical resistance degradation and moisture resistance degradation or the like of the peel strength.

As described above, a surface-treated copper foil not using chromium in the surface-treatment layer of an electro-deposited copper foil that satisfies basic requirements on a printed wiring board after processing, peel strength of a circuit, chemical resistance degradation and moisture resistance degradation or the like of the peel strength has been required.

Means to Solve the Problem

Therefore, the present inventors have conceived through keen research that by using the chromium-free surface-treated copper foil described below, enhanced adhesion performance to an insulating resin substrate can be achieved. The surface-treated copper foil according to the present invention will be described below.

The surface-treated copper foil according to the present invention is a surface-treated copper foil provided with a surface-treatment layer on a bonding surface of a copper foil used when a copper-clad laminate is manufactured by laminating it to an insulating resin substrate characterized in having the surface-treatment layer formed by depositing a metal component having high melting point not lower than 1400° C. to the bonding surface of the copper foil after finishing the cleaning treatment and further depositing a carbon component to the surface by dry process film formation method.

The metal component having high melting point not lower than 1400° C. that constitutes the surface-treatment layer provided on the bonding surface of the copper foil is preferable to be the component deposited in the equivalent thickness of 1 nm to 10 nm by using physical vapor deposition method.

The carbon component that constitutes the surface-treatment layer provided on the bonding surface of the copper foil is preferable to be the component deposited in the equivalent thickness of 1 nm to 5 nm by using physical vapor deposition method.

In the surface-treated copper foil according to the present invention, it is preferable that the metal component having high melting point not lower than 1400° C. is a titanium component.

The copper foil used for the surface treated copper foil according to the present invention is preferable to be the copper foil having a bonding surface without roughening treatment and has a surface roughness (Rzjis) of 2.0 μm or less.

The cleaning treatment performed on the surface treated copper foil according to the present invention is preferable to be a treatment for removing copper oxides on the surface of the copper foil.

The cleaning treatment performed on the surface treated copper foil according to the present invention is also preferable to be a process forming a copper layer on the surface of the copper foil by dry process film formation method.

Advantages of the Invention

The surface-treated copper foil according to the present invention is manufactured by performing the cleaning treatment on the bonding surface of the copper foil to be laminated to an insulating resin substrate and then components, metal component having high melting point not lower than 1400° C. and a carbon component are deposited sequentially. In addition, when the metal component having high melting point not lower than 1400° C. and the carbon component are deposited, a dry process film formation method (including physical vapor deposition method) is proactively used. By using a dry process film formation method, forming of a surface-treatment layer having an excellent uniformity of thickness and less deviation in the composition in a common plane can be enabled when compared to the case where an electrochemical method is used. It means that the proactive use of dry process film formation method for forming a surface-treatment layer instead of conventional electrochemical process enables formation of a surface-treatment layer quite different from a layer formed in a conventional surface treatment of an electro-deposited copper foil. By using the surface treated copper foil according to the present invention, adhesion performance of a copper foil on a copper-clad laminate after manufacturing and adhesion performance of a circuit on a printed wiring board after processing can be made sufficient without an anchoring effect to an insulating resin substrate which is achieved by roughening a bonding surface of the copper foil.

Further, in the surface-treated copper foil according to the present invention, the cleaning treatment is performed on a bonding surface of the copper foil to be laminated to an insulating resin substrate. Then, a metal component having high melting point not lower than 1400° C. and a carbon component are deposited sequentially. According to the procedure above, the adhesion performance of the metal component having high melting point not lower than 1400° C. and the carbon component to the copper foil surface is drastically enhanced.

EMBODIMENT OF THE INVENTION

Embodiments of the surface-treated copper foil according to the present invention will be described below.

Embodiments of the surface-treated copper foil according to the present invention: The surface-treated copper foil according to the present invention is a surface-treated copper foil provided with a surface-treatment layer on a bonding surface of a copper foil used when a copper-clad laminate is manufactured by laminating it to an insulating resin substrate. It means that the surface-treatment layer should be provided at least on the bonding surface of the copper foil. However, a surface-treatment layer may be provided on the opposite surface to perform rust-proofing effect to secure long-term shelf life of the surface-treated copper foil. The surface-treatment layer on the opposite surface may be the same surface-treatment layer as on the bonding surface. However, when the effect required for the surface treatment of the opposite surface is just rust-proofing effect, inorganic rust-proofing treatment including zinc or organic rust-proofing treatment using benzotriazole or imidazole or the like may be applicable with consideration of cost.

The surface-treated copper foil according to the present invention is manufactured by using an untreated copper foil without surface-treatment layer. The copper foil may be prepared by any manufacturing method, both of an electro-deposited copper foil and a rolled copper foil can be used. In addition, with regard to the thickness of the copper foil, it is not specifically limited, and a copper foil having any thickness suitable for the application may be used. In general, a copper foil having a thickness in the range of 6 μm to 300 μm may be used. Further, with regard to a copper foil having a thickness less than 6 μm, using in the state as an ultrathin copper foil supported by a carrier foil (a copper foil with a carrier foil) in which a carrier foil and an ultrathin copper foil are temporarily laminated via a bonding interface is preferable.

The above-mentioned surface-treatment layer provided on the bonding surface of the copper foil to be laminated to an insulating resin substrate will be described below. In the surface-treated copper foil according to the present invention, the bonding surface of the copper foil on which the surface-treatment layer is formed is performed the cleaning treatment before forming the surface-treatment layer. The cleaning treatment is the process performed to make the surface of the copper foil in the state free from copper oxide to utmost extent, i.e. the state close to where metal copper is fully exposed. That is, adhesion performance between a copper foil and a surface-treatment layer may be deteriorated by an oxidized layer or contamination formed on the surface of the copper foil, but by performing the cleaning treatment, the state where the surface of the copper foil is free from the excess copper oxides is achieved which can prevent deterioration of the adhesion performance. In practice, it is enough that at least a bonding surface of the copper foil to be laminated to an insulating resin substrate, i.e. the surface on which the surface-treatment layer is formed, is made clean. In addition, the treatment may be performed on both surfaces of the base copper foil.

By employing either the method removing copper oxides or the method depositing fresh copper to the surface of a copper foil by dry process film formation method as the cleaning treatment, a surface of the copper foil close at possible extent to the fully exposed copper metal may be prepared.

The cleaning treatment removing copper oxides from the surface of a base copper foil will be described below. As the cleaning treatment methods, sputtering treatment and plasma treatment or the like can be exemplified. When the sputtering treatment is used, argon ions or nitrogen ions or the like are accelerated in a vacuum chamber by an ion gun or the like to collide with the surface of the copper foil to ionize copper oxides on the surface of the copper foil and eject by the collision to remove copper oxide mainly to make copper metal on the surface of the copper foil expose to the possible extent and then the copper foil surface is made clean. In addition, electron shower used in combination with sputtering treatment may perform preferable cleaning. When the plasma treatment is used, copper oxides on the surface of a copper foil are removed by using a capacitively-coupled plasma source or the like to momentarily sublimate a copper oxide on the surface of the copper foil and then the surface of the copper foil is made clean.

Next, the cleaning treatment to achieve the state in which copper metal is exposed on the surface of a copper foil by dry process film formation method will be described. The dry process film formation method to make the surface clean is the method including a gas phase reaction method such as chemical vapor deposition method in addition to so-called physical vapor deposition method such as sputtering deposition method, vacuum vapor deposition method, EB vapor deposition method or the like. One example which should be described may be, when a sputtering deposition method is used, the state that fresh copper metal is exposed is achieved by using a copper target and making copper atoms land on the surface of a copper foil in a vacuum chamber. As described, when the base surface of a copper foil is made clean by using physical vapor deposition method, thickness of the copper film is preferable to be not less than 10 nm to reduce deviation of a thickness of the copper film formed on the surface of the copper foil.

After finishing the cleaning treatment on the bonding surface of a copper foil, a surface-treatment layer is formed later. At first, a metal component having high melting point not lower than 1400° C. is deposited to the bonding surface of the copper foil. When the carbon component described later is just deposited to the surface of the copper foil without depositing of the metal component having high melting point, deviation of adhesion state between the surface-treated copper foil and an insulating resin substrate tends to occur. In particular, deviation in the adhesion performance among location-to-location is made large in the common plane of the resulted copper-clad laminate. So, it is not preferable. With regard to a metal component having high melting point not lower than 1400° C. here, any one selected from titanium, nickel, cobalt, zirconium, and tungsten is preferable to be used. However, when manufacturing processes of a printed wiring board is considered and conditions including removal by etching or the like are also considered, titanium is more preferable to be used. The metal component having high melting point not lower than 1400° C. is preferable to be deposited by dry process film formation method. When efficiency of film formation is considered in these methods, it is preferable to use physical vapor deposition method such as sputtering deposition method, vacuum vapor deposition method, EB vapor deposition method or the like. Further, when various control factors such as efficiency of film formation, stability in thickness of the formed film, and easiness in process control or the like are considered, and in view of easiness in controlling these factors, sputtering deposition method is the most preferable to be used.

Next, a metal component having high melting point not lower than 1400° C. (hereinafter simply referred to as "high melting point metal component") is preferable to be deposited to make the equivalent thickness of 1 nm to 10 nm. When a deposited amount of a high melting point metal component is less than 1 nm, no effect may be achieved by deposition of the high melting point metal component and result poor adhesion performance between the surface-treated copper foil and the insulating resin substrate. In contrast, when the deposited amount of the high melting point metal component exceeds 10 nm, the amount of the high melting point metal component may be too excessive to make removal by dissolving with etching solution difficult in production of a printed wiring board and etching time required might be made long to result difficulty in forming of a fine-pitch circuit having a good etching factor. The term "equivalent thickness" used in the present application refers to a thickness estimated from mass of the components in the surface-treated copper foil obtained in analysis by using an ICP apparatus after dissolving in chemicals. In the way described above, a high melting point metal component is deposited to the surface of a copper foil.

Then, a carbon component is deposited to the surface of the high melting point metal component. As described above, by depositing the carbon component in addition to the high melting point metal component, adhesion performance between the surface-treated copper foil and an insulating resin layer is enhanced and stabilized also. Deposition of the carbon component is preferable to be performed by using physical vapor deposition method. The method used is not specifically limited but, when a sputtering deposition method is used, a carbon target is collided with an argon ions or the like, and carbon component is deposited on the surface of a copper foil.

Next, the carbon component in the method is preferable to be deposited with the equivalent thickness of 1 nm to 5 nm. When a deposited amount of the carbon component is less than 1 nm, effect which should be achieved by the deposited carbon component may not be achieved, i.e. the resultant state is just that the high melting point metal component is deposited and it may result insufficient adhesion performance between the surface-treated copper foil and the insulating resin substrate. In contrast, when an amount of the carbon component exceeds 5 nm, deposited amount of carbon component is too much and it makes amount of the carbon component which makes the conductor resistance increase on the bottom surface of the processed copper foil circuit too much when processed to a printed wiring board. So, it is not preferable. Further, in the method for measuring the equivalent thickness of the carbon component, a piece of specimen cut from the surface-treated copper foil according to the present invention is placed in the high-temperature oxygen gas stream in a gas analyzer to generate carbon monoxide gas and carbon dioxide gas by the reaction between the oxygen gas in the stream and the carbon component, then mass of the carbon monoxide gas and carbon dioxide gas are measured to obtain the amount of the carbon component per unit area, which is further converted to the thickness per unit area.

The surface-treatment layer described above is suitable for a surface-treated copper foil for use in laminating it to an insulating resin substrate without roughening treatment. In a popular copper foil, the roughening treatment is performed on the surface before the surface treatment. When a copper foil is provided with roughening treatment in nodulous shape on a bonding surface, the nodules constituting roughening treatment are buried into the insulating resin substrate by pressing to perform an anchoring effect and adhesion performance is enhanced. However, when such roughening treatment exist, long time for etching (over-etching time) is required in addition because the roughening treatment buried into the insulating resin substrate are not removed yet after finishing dissolving of a bulk portion of the surface-treated copper foil by etching. The longer the over-etching time, etching of the finished copper foil circuit may progress and an etching factor of the copper foil circuit might be made poor. In contrast, in the surface-treated copper foil according to the present invention, a sufficient adhesion performance to an insulating resin layer can be achieved even when a copper foil having an untreated surface is used in manufacturing of the surface-treated copper foil. In addition, when a surface roughness (Rzjis) of the untreated copper foil is made to be 2.0 μm or less, the over-etching time for etching process can be drastically reduced, and it makes improvement of the etching factor of the finished copper foil circuit easy. In the present application, the surface roughness is demonstrated as the roughness of the bonding surface of an untreated copper foil because the surface roughness does not substantially change before and after the surface treatment for forming the surface-treatment layer according to the present invention as the surface roughness is measured by a stylus type surface profile meter.

Next, a method for manufacturing the surface-treated copper foil according to the present invention will be described. The method for manufacturing the surface-treated copper foil described above include Step A and Step B described below. Each of the steps will be demonstrated one by one.

Step A: The present step performs the cleaning treatment on the surface of a copper foil. The term "the cleaning treatment" here refers to a treatment for exposing copper metal on the surface of the copper foil to be a base where the surface-treatment layer is formed. Because the cleaning treatment is already described above, description is omitted.

Step B: On the cleaned copper foil, a surface-treatment layer composed of metal component having a high melting point not lower than 1400° C. and a carbon layer is formed by dry process film formation method to finish the surface-treated copper foil.

When physical vapor deposition method is used as a method of dry process film formation method in formation of a film of metal component having a high melting point not lower than 1400° C., sputtering deposition method is preferable to be used also. With regard to the conditions for the sputtering deposition, it is not specifically limited, but conditions may include using of a titanium target, nickel target or the like, an ultimate vacuum Pu of not higher than $1 \times 10^{-3}$ Pa, a sputtering pressure PAr of 0.1 Pa to 3.0 Pa, a sputtering power density of 0.1 W/cm$^2$ to 3 W/cm$^2$ for a period of 5 sec to 20 sec, and argon ions for sputtering seeds, or the like.

In addition, the physical vapor deposition method for depositing carbon later is not limited as a specified manufacturing method. Any popular method of physical vapor deposition method may be applied. Next, examples and comparative examples will be described below to make understanding of the present invention easy.

EXAMPLES

The surface-treated copper foils were prepared respectively in Examples 1 to 5 in which equivalent thicknesses of the deposited titanium component and carbon component are arranged as shown in Table 1. Then, a resin coated copper foil coated with a polyethersulfone based resin was prepared, followed by laminating to a FR-4 substrate and then adhesion performances of the bonding surfaces to the FR-4 substrate were evaluated.

Cleaning treatment: As the cleaning treatment, the example in which the state where copper metal is exposed on the surface of a copper foil by sputtering deposition method will be described. First, a wound roll of electro-deposited copper foil having a bonding surface with a surface roughness Rzjis of 1.3 μm and a thickness of 18 μm was prepared. Water-cooled DC magnetron sputtering equipment was used as sputtering equipment. The copper component having a thickness of 50 nm was deposited by using a copper target having a size of 150 mm by 300 mm with a sputtering condition, an ultimate vacuum Pu of lower than $1 \times 10^{-1}$ Pa, a sputtering pressure PAr of 0.1 Pa, and a sputtering power of 1500 W for 10 sec.

Deposition of a titanium component: In the deposition of the titanium component to the bonding surface of a copper foil, using a titanium target having a size of 150 mm by 300 mm, a sputtering condition having an ultimate vacuum Pu of not higher than $1 \times 10^{-3}$ Pa, a sputtering pressure PAr of 0.1 Pa to 1 Pa, and a sputtering power of 100 W to 1000 W for 10 sec was employed in a water-cooled DC magnetron sputtering equipment to perform deposition of the titanium component.

Deposition of a carbon component: Then, the carbon component was deposited to the bonding surface of the copper foil on which the deposition of the titanium component was finished. The deposition of the carbon component was performed with the same sputtering equipment as for the deposition of titanium component, using a carbon target having a size of 150 mm by 300 mm with a sputtering condition having an ultimate vacuum Pu of lower than $1 \times 10^{-4}$ Pa, a sputtering pressure PAr of 0.1 Pa to 1 Pa, and a sputtering power of 500 W to 3000 W.

In deposition of titanium component and carbon component, depositions were adjusted by power densities to make equivalent thicknesses deposited be shown in Examples 1 to 5 disclosed in Table 1 respectively.

To the surface-treated copper foils prepared in Examples 1 to 5 as described above, a resin composed of polyethersulfones resin (Sumikaexcel PES-5003P made by Sumitomo Chemical Co., Ltd.) of 70 part by weight and epoxy resin (EPPN-502 made by Nippon Kayaku Co., Ltd.) of 30 part by weight was coated followed by air-drying, and then dry treated in a heated atmosphere at 140° C. to obtain resin coated copper foils coated with a semi-cured resin having a thickness of 2 μm.

Evaluation of adhesion performance: Each of the resin coated copper foils using the surface-treated copper foils prepared in Examples 1 to 5 were hot-pressed at 180° C. for 60 min with a FR-4 prepreg to prepare a copper-clad laminate. The printed wiring board test specimens provided with a linear circuit with a width of 0.4 mm formed by etching for measuring peel strength were prepared and then peel strengths were evaluated respectively. The peel strengths measured were, as received, after solder floating, after immersing into hydrochloric acid, and after pressure-cooker testing (hereinafter referred to as "PCT"), respectively. These evaluation results are collectively shown in Table 1.

The peel strength after solder floating is the peel strength measured in the printed wiring board test specimen after floating on a solder bath at 260° C. for 10 min and then cooled down to the room temperature for measurement.

The peel strength after immersing into hydrochloric acid was measured just after the steps of immersing the printed wiring board test specimen into a solution blended with a ratio of hydrochloric acid to water of one to two at 60° C. for 90 min, rinsing with water, and drying. The resistance to hydrochloric acid of a circuit can be evaluated by the measurement of the peel strength after immersing into the hydrochloric acid.

PCT is one kind of reliability tests for interlayer connections of a printed wiring board. The peel strength after PCT was measured after keeping the printed wiring board test specimen in a high-temperature and high-pressure atmosphere of 121° C. and 100% RH for 24 hours. The resistance to moisture of a circuit can be evaluated by the measurement of the peel strength after PCT.

Comparative Example

As a comparative example, a surface-treated copper foil having a titanium component as a high melting point metal component with the deposited equivalent thickness of 0.4 nm, which is out of the range specified in the present invention, will be described. As shown in Table 1, the peel strength of each surface-treated copper foil of Examples 1 to 5 is higher than that of the surface-treated copper foil of Comparative example 1.

TABLE 1

| | Sputtering pressure PAr (Pa) | equivalent thickness (nm) Ti | C | Peel strength (kN/m) As received | After solder floating | Resistance to hydrochloric acid | After PCT |
|---|---|---|---|---|---|---|---|
| Example 1 | 0.1 | 2.5 | 1.5 | 0.8 | 0.9 | 0.6 | 0.5 |
| Example 2 | 1 | 2.5 | 2 | 1.3 | 1.2 | 1.3 | 0.8 |
| Example 3 | 1 | 5 | 3 | 1.3 | 1.2 | 1.6 | 1.3 |
| Example 4 | 0.1 | 1.3 | 5 | 1.5 | 1.5 | 1.6 | 1.3 |
| Example 5 | 1 | 1.2 | 2 | 1.2 | 1.2 | 0.8 | 0.3 |
| Comparative example 1 | 1 | 0.4 | 1 | 0.2 | 0.2 | 0.1 | 0.1 |

INDUSTRIAL APPLICABILITY

The surface-treated copper foil according to the present invention is first performed the cleaning treatment on the surface of the copper foil to be used as bonding surface to an insulating resin substrate, and then a metal component having high melting point not lower than 1400° C. and a carbon component are deposited sequentially by using mostly physical vapor deposition method. By applying such construction, being different from a copper foil in which electrochemical process is applied for forming a surface-treatment layer, the surface-treatment layer is excellent in uniformity of the thickness, and formation of the surface-treatment layer without deviation of composition in a common plane can be achieved. As a result, deviation in adhesion performance depending on the measuring site of a copper foil to an insulating resin substrate after processing into a copper-clad laminate is made small. Furthermore, the surface-treated copper foil according to the present invention can be provided with a surface-treatment layer suitable for laminating the copper foil without roughening treatment to an insulating resin substrate with maintaining sufficient adhesion performance.

The invention claimed is:

1. A surface-treated copper foil comprising a copper foil and a surface-treatment layer formed on a bonding surface of the copper foil, by which the copper foil is bonded to an insulating resin substrate via the surface-treatment layer when a copper clad laminate is manufactured, wherein
   the surface-treatment layer is composed of a metal layer and a carbon layer, and the surface-treatment layer is provided on the bonding surface after the bonding surface is subjected to a cleaning treatment that fully exposes copper metal;
   the metal layer is composed of a metal having a melting point not lower than 1400° C. that is deposited on the bonding surface by a dry process film formation method after the bonding surface is subjected to the cleaning treatment; and
   the carbon layer is formed by depositing carbon on the metal layer by a dry process film formation method.

2. The surface-treated copper foil according to claim 1, wherein the metal is deposited through physical vapor deposition to a layer thickness of 1 nm to 10 nm.

3. The surface-treated copper foil according to claim 1, wherein the carbon is deposited through physical vapor deposition to a layer thickness of 1 nm to 5 nm.

4. The surface-treated copper foil according to claim 1, wherein the metal having a melting point not lower than 1400° C. is titanium.

5. The surface-treated copper foil according to claim 1, wherein the copper foil used is the copper foil having a bonding surface without roughening treatment and has a surface roughness (Rzjis) of 2.0 μm or less.

6. The surface-treated copper foil according to claim 1, wherein the cleaning treatment is a treatment for removing copper oxides on the surface of the copper foil.

7. The surface-treated copper foil according to claim 1, wherein the cleaning treatment is a dry film-formation process that forms a layer of copper on the bonding surface of the copper foil.

8. The surface-treated copper foil according to claim 1, wherein the surface-treatment layer enhances adhesion of the surface-treated copper foil to the insulating resin substrate.

* * * * *